(12) United States Patent
Uchino et al.

(10) Patent No.: US 10,546,799 B2
(45) Date of Patent: Jan. 28, 2020

(54) ELECTRONIC APPARATUS

(71) Applicant: LENOVO (SINGAPORE) PTE. LTD., Singapore (SG)

(72) Inventors: Akinori Uchino, Kanagawa (JP); Kazuo Fujii, Kanagawa (JP); Takuroh Kamimura, Kanagawa (JP); Kenji Watamura, Kanagawa (JP); Hiroshi Yamazaki, Kanagawa (JP); Takanori Hoshino, Kanagawa (JP)

(73) Assignee: LENOVO (SINGAPORE) PTE LTD, Singapore (SG)

( * ) Notice: Subject to any disclaimer, the term of this patent is extended or adjusted under 35 U.S.C. 154(b) by 0 days.

(21) Appl. No.: 16/040,317

(22) Filed: Jul. 19, 2018

(65) Prior Publication Data

US 2019/0037725 A1    Jan. 31, 2019

(30) Foreign Application Priority Data

Jul. 25, 2017  (JP) ................................ 2017-143292

(51) Int. Cl.
| | | |
|---|---|---|
| *G06F 1/16* | (2006.01) | |
| *H01L 23/427* | (2006.01) | |
| *G06F 1/20* | (2006.01) | |
| *G06F 1/18* | (2006.01) | |

(52) U.S. Cl.
CPC ............ *H01L 23/427* (2013.01); *G06F 1/16* (2013.01); *G06F 1/18* (2013.01); *G06F 1/20* (2013.01); *G06F 1/203* (2013.01)

(58) Field of Classification Search
CPC ............................... G06F 1/1626; G06F 1/203

USPC ............ 361/679.26, 679.27, 679.46, 679.52, 361/679.54, 704
See application file for complete search history.

(56) References Cited

U.S. PATENT DOCUMENTS

| | | | | |
|---|---|---|---|---|
| 5,060,114 A | * | 10/1991 | Feinberg ............... | H01L 23/433 165/185 |
| 5,549,155 A | * | 8/1996 | Meyer, IV .......... | F28D 15/0275 165/104.33 |
| 5,822,187 A | * | 10/1998 | Garner .................... | F28D 15/02 361/679.27 |
| 5,949,648 A | | 9/1999 | Liao | |
| 6,226,178 B1 | * | 5/2001 | Broder .................... | G06F 1/203 165/104.33 |
| 7,301,761 B2 | * | 11/2007 | Merz ................. | G02F 1/133308 361/679.27 |

(Continued)

FOREIGN PATENT DOCUMENTS

| | | |
|---|---|---|
| JP | 2000228594 A | 8/2000 |
| JP | 2015200217 A | 11/2015 |
| JP | 2015207569 A | 11/2015 |

*Primary Examiner* — Anthony Q Edwards
(74) *Attorney, Agent, or Firm* — Antony P. Ng; Russell Ng PLLC

(57) ABSTRACT

An electronic apparatus is provided. The electronic apparatus includes a main body chassis equipped with a keyboard device, a CPU, a heat diffusion component and a heat transport component. The CPU is disposed on a rear end side beyond the keyboard device. The heat diffusion component is disposed at a position located under the keyboard device in a mutually superposed state. The heat transport component is connected between the CPU and the heat diffusion component to provide heat transfer.

10 Claims, 7 Drawing Sheets

(56) References Cited

U.S. PATENT DOCUMENTS

| | | | | |
|---|---|---|---|---|
| 7,548,428 | B2* | 6/2009 | Lev | G06F 1/203 |
| | | | | 165/104.26 |
| 7,701,717 | B2* | 4/2010 | Cheng | G06F 1/203 |
| | | | | 165/104.26 |
| 7,986,520 | B2* | 7/2011 | Yamaguchi | F28D 15/0275 |
| | | | | 165/185 |
| 9,606,586 | B2* | 3/2017 | Rubenstein | G06F 1/20 |
| 10,025,358 | B2* | 7/2018 | Yoshida | G06F 1/203 |
| 2004/0080908 | A1* | 4/2004 | Wang | G06F 1/203 |
| | | | | 361/679.47 |
| 2004/0130869 | A1* | 7/2004 | Fleck | G06F 1/203 |
| | | | | 361/679.26 |
| 2009/0268392 | A1* | 10/2009 | Cheng | G06F 1/203 |
| | | | | 361/679.52 |
| 2010/0258277 | A1* | 10/2010 | Chen | H01L 23/4093 |
| | | | | 165/104.26 |
| 2013/0194739 | A1* | 8/2013 | Nakajima | G06F 1/1616 |
| | | | | 361/679.09 |
| 2015/0327400 | A1* | 11/2015 | Wang | H05K 7/20272 |
| | | | | 361/696 |
| 2016/0252937 | A1* | 9/2016 | Yoshida | G06F 1/203 |
| | | | | 361/679.26 |
| 2016/0258691 | A1* | 9/2016 | Wang | G06F 1/1662 |
| 2018/0088637 | A1* | 3/2018 | Uchino | F28D 15/0275 |

* cited by examiner

ELECTRONIC APPARATUS

PRIORITY CLAIM

The present application claims benefit of priority under 35 U.S.C. §§ 120, 365 to the previously filed Japanese Patent Application No. JP2017-143292 with a priority date of Jul. 25, 2017, which is incorporated by reference herein.

TECHNICAL FIELD

The present invention relates to electronic apparatuses in general, and in particular to an electronic apparatus with a processor being disposed within a main body chassis.

BACKGROUND

A laptop personal computer (laptop PC) typically includes a central processing unit (CPU) mounted on a motherboard disposed under a keyboard device. For laptop PCs, CPU is usually the largest heating element. Therefore, in some laptop PCs, heat generated from a CPU is radiated to the outside via a heat pipe connected to the CPU.

A keyboard device having, for example, a key top, a pantograph-type guide mechanism, a membrane sheet, a base plate, etc., requires a certain thickness. In addition, a substrate and a CPU mounted on the substrate have a certain thicknesses. Therefore, in a configuration that the substrate and the CPU are disposed at a position located under the keyboard device in a mutually superposed state as in the above-described structure, a section where the keytop, the guide mechanism, the membrane sheet, the base plate, etc., are built up has a considerable thickness and hinders the thinning of the main body chassis. In addition, when the heat pipe for radiating the heat from the CPU is made to pass under the keyboard device, the thickness of the heat pipe is added, which makes the thinning of the main body chassis even more difficult.

Consequently, it would be desirable to provide an electronic apparatus that is capable of promoting the thinning of a chassis having a CPU.

SUMMARY

In accordance with an embodiment of the present disclosure, an electronic apparatus includes a main body chassis equipped with a keyboard device, a CPU, a heat diffusion component and a heat transport component. The CPU is disposed on a rear end side beyond the keyboard device. The heat diffusion component is disposed at a position located under the keyboard device in a mutually superposed state. The heat transport component is connected between the CPU and the heat diffusion component to provide heat transfer.

With the above-mentioned configuration, the heat generated from the CPU is transported to the heat diffusion component via the heat transport component, and is diffused by the heat diffusion component. Accordingly, the heat generated from the CPU can be absorbed efficiently. In particular, a time taken until the CPU enters a thermally saturated state is prolonged even in a state where a processing burden on the CPU is increased and therefore it is possible to suppress a reduction in processing speed of the CPU. Moreover, the CPU for which a space that is relatively large in a top-bottom direction is necessary in the main body chassis and part of the heat transport component which is connected to the CPU are not built up under the keyboard device. On the other hand, the heat diffusion component for which a large closed space volume is necessary is disposed in a space located under the keyboard device under which it is possible to secure a space that is low in height but is large because the CPU is not disposed. Therefore, it is possible for the electronic apparatus to obtain a highly efficient heat diffusion performance while promoting the thinning of the main body chassis.

All features and advantages of the present disclosure will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION

Figure 1:
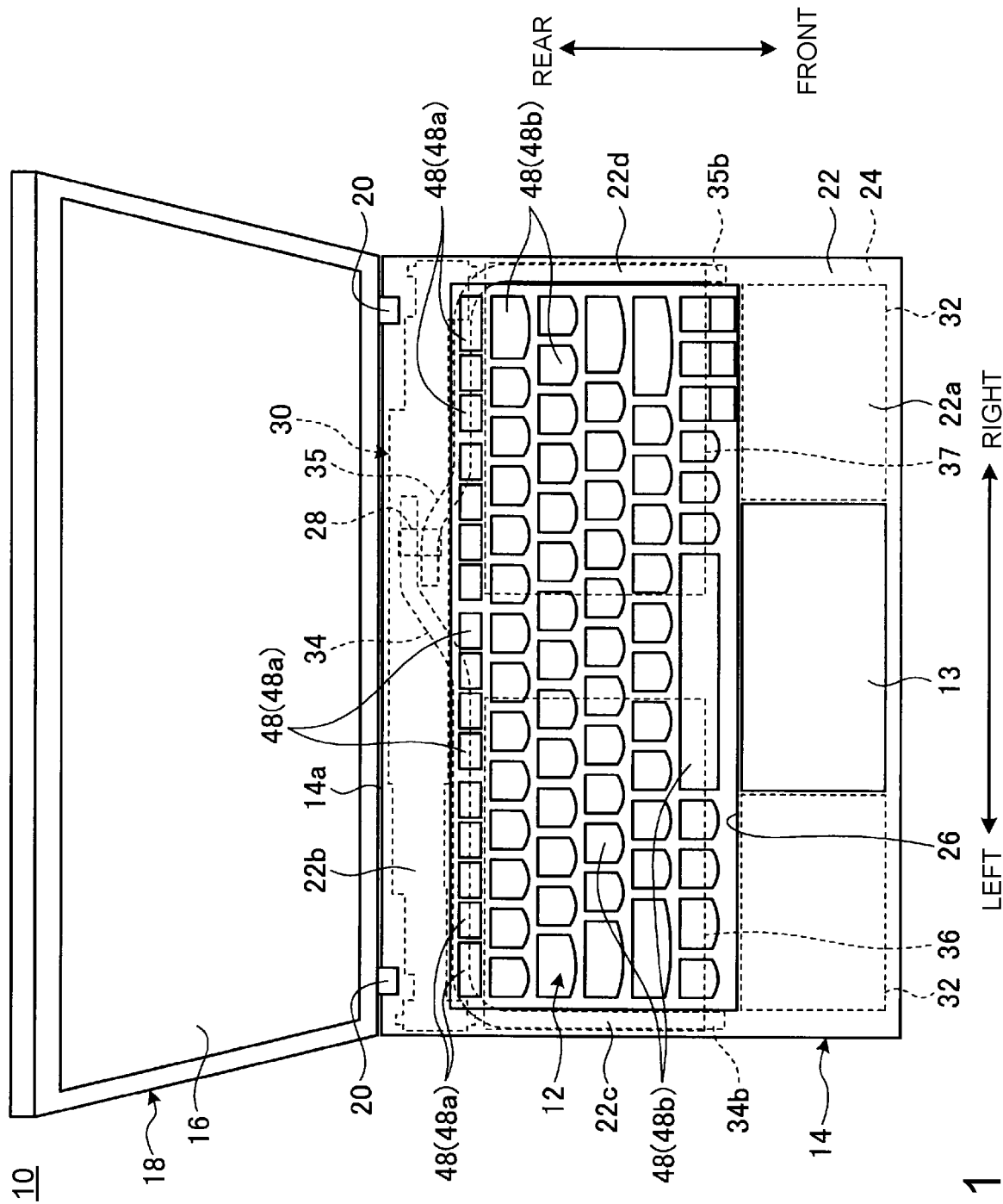
FIG. 1 is a plan view of an electronic apparatus, according to one embodiment.

FIG. 1 is a plan view illustrating one example of the electronic apparatus 10 according to one embodiment of the present invention. In the present embodiment, the electronic apparatus 10 which is configured as a Laptop PC will be exemplified.

As illustrated in FIG. 1, the electronic apparatus 10 includes a main body chassis 14 on which a keyboard device 12 and a touch pad 13 are disposed and a display chassis 18 on which a display 16 is disposed. The display chassis 18 is coupled to a rear end 14a of the main body chassis 14 to be rotationally movable via one pair of left and right hinges 20, 20.

FIG. 1 is a diagram illustrating a state of viewing the electronic apparatus 10 which is brought into a use state by lifting upward the display chassis 18 from the main body chassis 14 via the hinges 20 from above. In the following, description will be made by setting a direction that the display 16 of the electronic apparatus 10 which is in the use state in FIG. 1 is visually recognized from a front face as a standard and calling the front side as the front, the back side as the back, a thickness direction as a top-bottom direction and a width direction as a left-right direction in regard to the main body chassis 14.

The display chassis 18 is electrically connected with the main body chassis 14 by not illustrated wiring which is laid passing through the hinges 20. The display 16 is, for example, a liquid crystal display.

Figure 2:
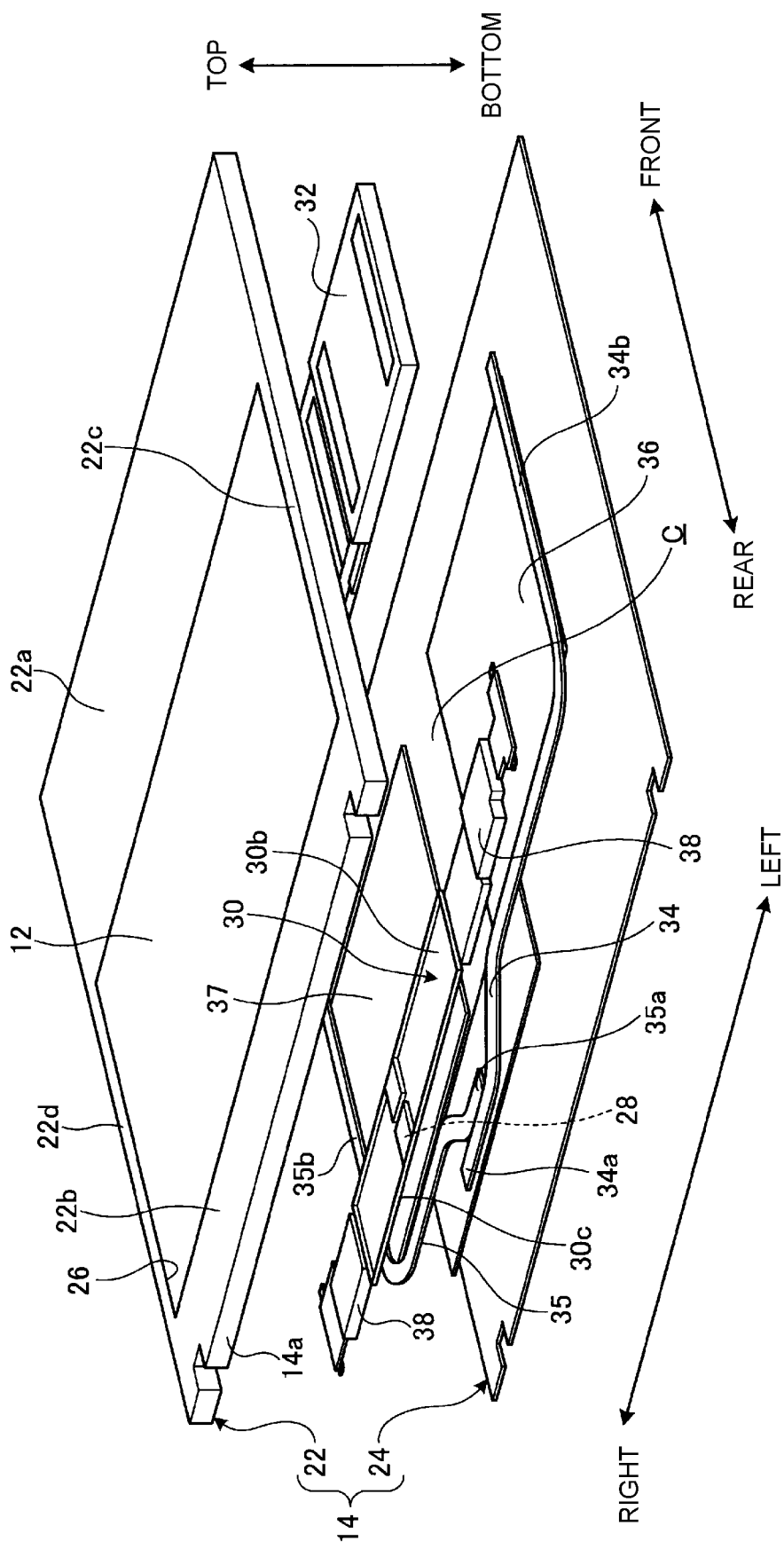
FIG. 2 is an exploded perspective view of an inner structure of a main body chassis.

FIG. 2 is an exploded perspective view illustrating one example of an inner structure of the main body chassis 14.

In FIG. 2, the keyboard device 12 is illustrated in a simplified plate-shaped form and illustration of the touch pad 13 is omitted.

As illustrated in FIG. 1 and FIG. 2, the main body chassis 14 is a thin box-shaped chassis which is formed by an upper-face cover 22 and a lower-face cover 24.

The upper-face cover 22 is a plate-shaped member whose walls which serve as sidewalls of the main body chassis 14 are formed to project toward the periphery. The upper-face cover 22 configures an upper face and four peripheral side faces of the main body chassis 14. The lower-face cover 24 is a plate-shaped member which configures a bottom face of the main body chassis 14.

An upper face of the upper-face cover 22 is formed by an opening 26, a front cover part 22a, a rear cover part 22b and left and right side cover parts 22c and 22d. The opening 26 is a rectangular opening which is disposed in a rearward-oriented central part of the upper-face cover 22 and in which the keyboard device 12 is to be disposed. That is, the opening 26 serves as an installation position of the keyboard device 12. The front cover part 22a is a plate part which is located on the front side of the opening 26 and extends in the left-right direction. An opening in which the touch pad 13 is to be disposed is formed in a left-right direction central part of the front cover part 22a. The rear cover part 22b is a plate part which is located on the rear side of the opening 26 and extends in the left-right direction. The rear cover part 22b is smaller than the front cover part 22a in front-back direction width. The left and right side cover parts 22c and 22d are narrow-width plate parts which are located on the left and right sides of the opening 26 respectively and extend in the front-back direction. For example, in a case where a configuration that the keyboard device 12 is disposed across almost full left and right widths of the upper-face cover 22 is made, the left and right side cover parts 22c and 22d are formed into line shapes having almost no width or are omitted.

Figure 3:
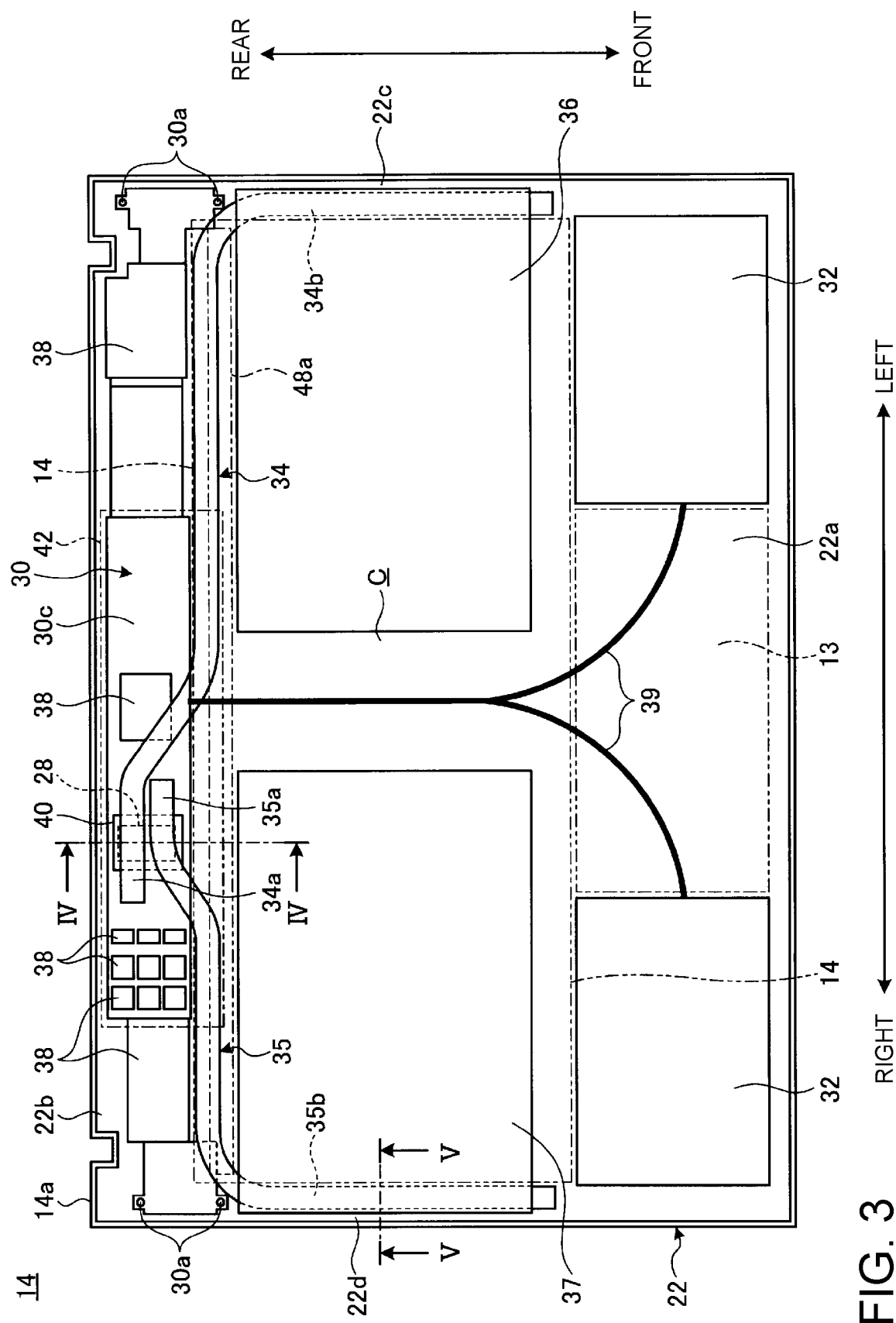
FIG. 3 is a bottom face view of the inner structure of the main body chassis.
Figure 4:
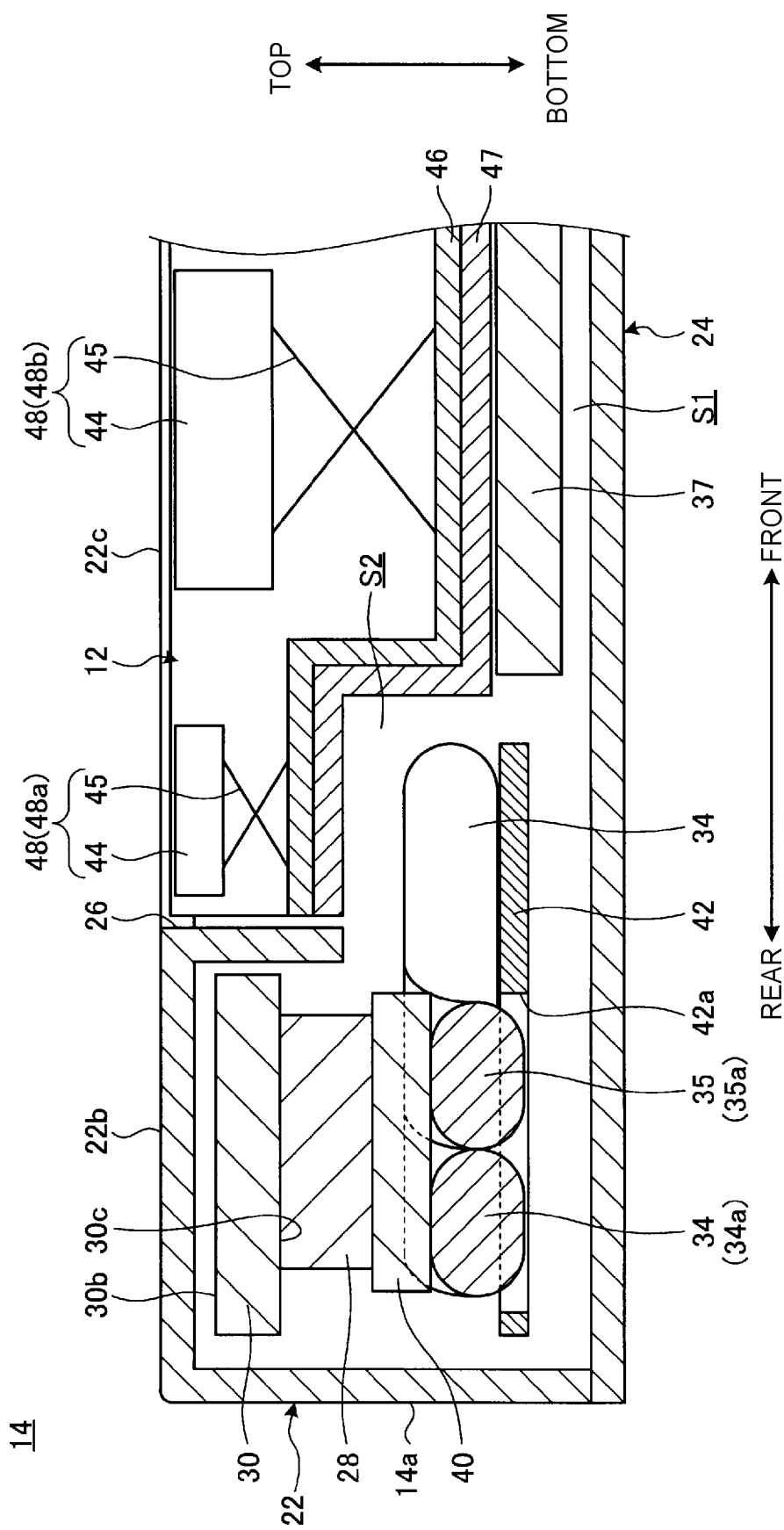
FIG. 4 is a cross-sectional diagram taken long the IV-IV line in FIG. 3.
Figure 5:
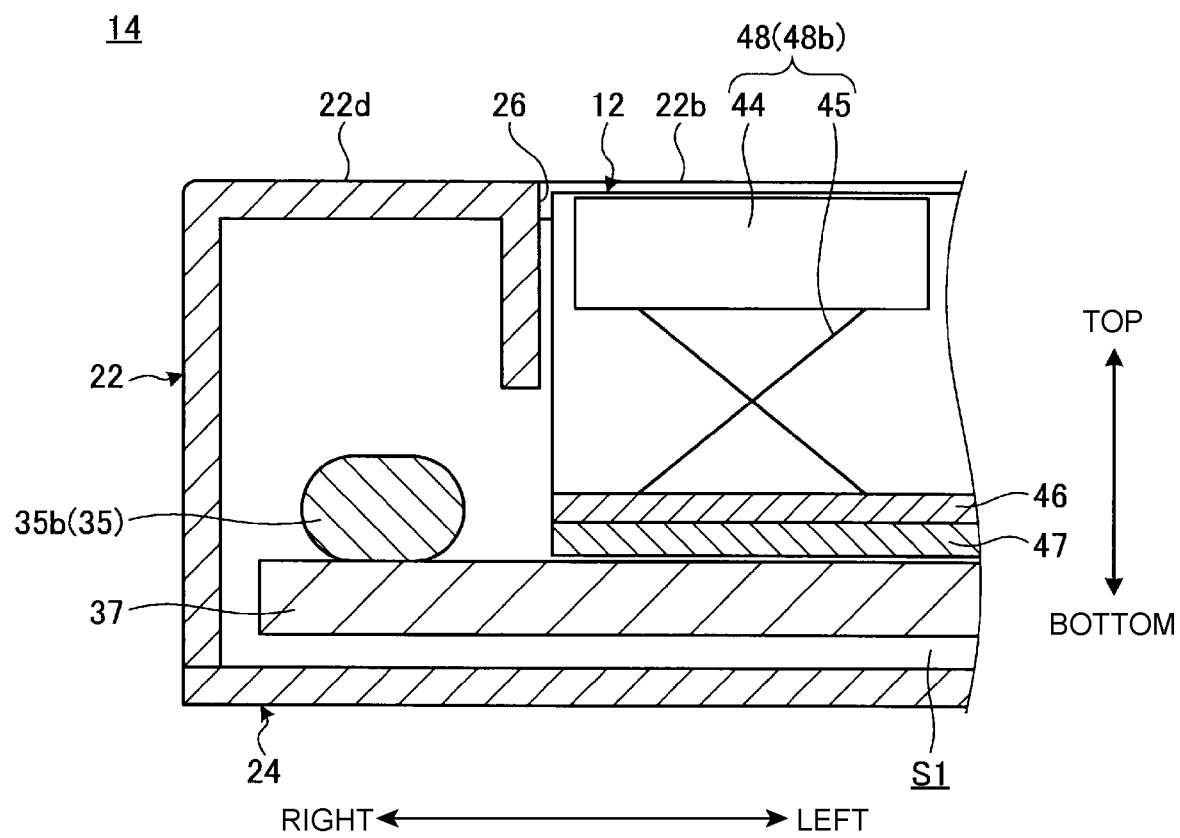
FIG. 5 is a cross-sectional diagram taken along the V-V line in FIG. 3.

FIG. 3 is a bottom face diagram schematically illustrating one example of the inner structure of the main body chassis 14. FIG. 3 is the schematic diagram illustrating a state of viewing the inside of the main body chassis 14 from the inner face side of the upper-face cover 22 by removing the lower-face cover 24. FIG. 4 is a schematic sectional diagram taken along the IV-IV line in FIG. 3. FIG. 5 is a schematic sectional diagram taken along the V-V line in FIG. 3.

As illustrated in FIG. 2 to FIG. 5, a CPU 28, a substrate 30, a battery device 32, two heat transport components 34, 35 and one pair of left and right heat diffusion components 36, 37 are included in the main body chassis 14.

The CPU 28 is a central processing unit which is mounted on the substrate 30 and performs arithmetic operations concerning main control and processing of the electronic apparatus 10 according to the present embodiment. The CPU 28 is the largest heating element in electronic components which are included in the main body chassis 14. A top-bottom direction thickness (a sheet thickness) of the CPU 28 is, for example, 0.85 mm.

The substrate 30 is a Printed Circuit Board (PCB) on which various electronic components 38 such as, for example, a Graphics Processing Unit (GPU), a memory, a capacitor and so forth are mounted other than the CPU 28. The substrate 30 is screwed and fixed to the inner face of the rear cover part 22b of the upper-face cover 22 using attachment holes 30a which are formed in the both ends of the substrate 30 as one pair of front and rear holes. In the substrate 30, an upper face 30b serves as an attachment face to which the upper-face cover 22 is to be attached and a lower face 30c serves as a face on which the CPU 28 and the electronic components 38 are to be mounted. Some electronic components 38 may be mounted on the upper face 30b. The substrate 30 has a strip shape which is narrow in width in the front-back direction and, on the other hand, extends across almost the full left and right widths of the main body chassis 14 in the left-right direction. Most part of the substrate 30 is disposed at a position located under the rear cover part 22b in a mutually superposed state. In the present embodiment, only parts of front ends on the both sides of the substrate 30 are disposed under the keyboard device 12 in the mutually superposed state (see FIG. 3). The substrate 30 may be configured to have an arrangement and a shape that the substrate 30 is not disposed under the keyboard device 12 in a completely superposed state and is disposed only under the rear cover part 22b in the mutually superposed state. A sheet thickness of the substrate is, for example, 0.65 mm.

The battery device 32 is a storage battery which serves as a power source of the electronic apparatus 10 according to the present embodiment. One pair of the left and right battery devices 32 is disposed at a position located under the front cover part 22a of the upper-face cover 22 which serves as a palm rest in the mutually superposed state. In the present embodiment, since the touch pad 13 is disposed on a central part of the front cover part 22a, the battery devices 32 are disposed on the left and right sides of the touch pad 13 respectively. In a structure and so forth with no provision of the touch pad 13, the battery devices 32 may be formed into a shape that the battery devices 32 extend across full left and right widths of the front cover part 22a. It is possible to secure a large volume by disposing the battery devices 32 at a position where the front cover part 22a and the battery devices 32 are mutually superposed. Wiring 39 which includes a power source line from the battery device 32 and a signal line from the touch pad 13 is connected to the substrate 30 passing through a gap C which is formed between the left and right heat diffusion components 36 and 37.

One ends 34a and 35a of the respective heat transport components 34, 35 are connected to the CPU 28 to make heat transfer possible and the other ends 34b and 35b of the respective heat transport components 34 and 35 are connected to the heat diffusion components 36 and 37 respectively to make heat transfer possible. The respective heat transport components 34 and 35 are components which transport the heat generated from the CPU 28 to the respective heat diffusion components 36 and 37. Each of the heat transport components 34 and 35 is a heat pipe which is formed by crushing a metallic conduit in which a closed space is formed by, for example, joining together its both ends and is able to transport the heat highly efficiently by utilizing a change in phase of a working fluid which is encapsulated in the closed space. A sheet thickness of the heat transport components 34 and 35 is, for example, 0.8 mm. For example, in a case where the heat transport distance is short and the transport heat amount is small, each of the heat transport components 34 and 35 may be configured by a metal bar and so forth made of a material which is high in thermal conductivity such as, for example, copper, aluminum and so forth other than the heat pipe.

The respective one ends 34a and 35a are connected to a lower face (a top face) of the CPU 28 respectively to make heat transfer possible with a heat receiving plate (a heat conduction member) 40 being interposed. The heat receiving plate 40 is a metal plate made of the material which is high in thermal conductivity such as, for example, copper, aluminum and so forth and a plate thickness of the heat receiving plate 40 is, for example, 0.5 mm. The heat receiving plate 40 is a component adapted to ensure adhesion between the heat transport components 34 and 35 and the CPU 28, and thereby to improve the thermal conductivity. The heat receiving plate 40 may be omitted.

One heat transport component 34 extends from the one end 34a which is connected to the rear side of the lower face of the CPU 28 diagonally left forward and extends leftward passing under a rear end of the keyboard device 12 and thereafter is bent forward and extends forward and a part which extends forward forms the other end 34b. The other end 34b is connected to an upper face of a left edge of the left heat diffusion component 36 while extending forward passing through a position which is located under the left side cover part 22c and corresponds to the left side of the keyboard device 12. Almost similarly to the heat transport component 34, the other heat transport component 35 extends from the one end 35a which is connected to the front side of the lower surface of the CPU 28 diagonally right forward and extends rightward passing under the rear end of the keyboard device 12 and thereafter is bent forward and extends forward and a part which extends forward forms the other end 35b. The other end 35b is connected to an upper face of a right edge of the right heat diffusion component 37 while extending forward passing through a position which is located under the right side cover part 22d and corresponds to the right side of the keyboard device 12.

Most parts of external forms of the respective heat diffusion components 36 and 37 are disposed at a position located under the keyboard device 12 in the mutually superposed state and are arranged side by side with the gap C in which it is possible to lay the wiring 39 being interposed between mutually adjacent end faces thereof. The respective heat diffusion components 36 and 37 are components which diffuse the heat which is generated from the CPU 28 and transported through the respective heat transport components 34 and 35 in their volume ranges and store and radiate the heat. Each of the respective heat diffusion components 36 and 37 is a plate-shaped vapor chamber in which the closed space is formed by, for example, joining together peripheral edges of two metal plates and is able to highly efficiently diffuse the heat in accordance with the change in phase of the working fluid which is encapsulated in the closed space. Incidentally, in the present embodiment, the wiring 39 is built up together with the heat diffusion components 36 and 37 to increase a thickness of a part under the keyboard device 12 by passing the wiring 39 through the gap C between the left and right heat diffusion components 36 and 37 and thereby it is possible to prevent the main body chassis 14 from being thickened.

Each of the heat diffusion components 36 and 37 may be configured by the metal plate made of the material which is high in thermal conductivity such as, for example, copper, aluminum and so forth, a graphite plate, a heat lane and so forth other than the vapor chamber. Incidentally, the heat lane is a plate-type heat diffusion component which makes latent heat transport using vapor obtained by evaporation of the working fluid which is encapsulated in a flow path formed in the plate caused by heat absorption and sensible heat transport utilizing a vibration of the working fluid which is in a liquid phase occurs.

Although only one of the heat transport components 34 and 35 may be used, simultaneous use of the two heat transport components 34 and 35 improves the heat transport performance. Incidentally, in a case where only one of the heat transport components 34 and 35 is used, it is preferable to configure the heat diffusion components 36 and 37 by, for example, one plate-shaped member and to secure the gap C through which the wiring 39 is made to pass on one of the left and right sides of the plate-shaped member.

As illustrated in FIG. 3 and FIG. 4, in the present embodiment, a heat absorbing member 42 is disposed on the lower face sides of the heat transport components 34 and 35. The heat absorbing member 42 is the metal plate made of the material which is high in thermal conductivity such as, for example, copper, aluminum and so forth and covers most part of the substrate 30 including the CPU 28 and the various electronic components 38 and parts of the heat transport components 34, 35. A sheet thickness of the heat absorbing member 42 is, for example, 0.2 mm. The heat absorbing member 42 is a component (a thermal spreader) adapted to make the temperature around the substrate 30 uniform by absorbing the heat generated from the CPU 28 and so forth directly or indirectly via the heat transport components 34 and 35, diffusing and radiating the absorbed heat. The heat absorbing member 42 also has a function of supporting the heat transport components 34, 35 and the heat receiving plate 40 in press contact with the CPU 28.

The heat absorbing member 42 has a clearance hole 42a in a part located under the CPU 28. That is, the heat transport components 34 and 35 are disposed in contact with most part of an upper face of the heat absorbing member 42. However, the heat absorbing member 42 has a shape and an arrangement that the one ends 34a and 35a of the heat transport components 34 and 35 are pressed down by one stage by the amount corresponding to the thickness of the heat receiving plate 40 on its part located under the CPU 28. Therefore, the heat absorbing member 42 absorbs heat of the amount corresponding to the stepped-down parts of the one ends 34a and 35a through the clearance hole 42a. The heat absorbing member 42 may be omitted.

Figure 6A:
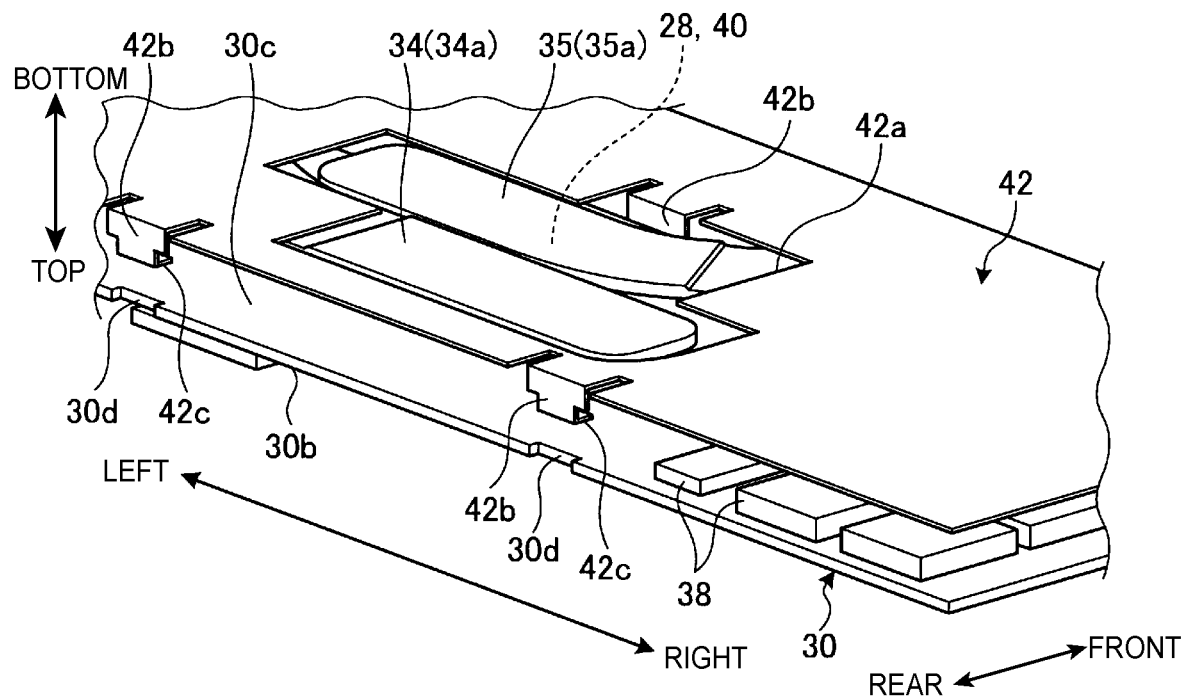
FIG. 6A is an exploded perspective view of a structure of attaching a heat absorbing member to a substrate.
Figure 6B:
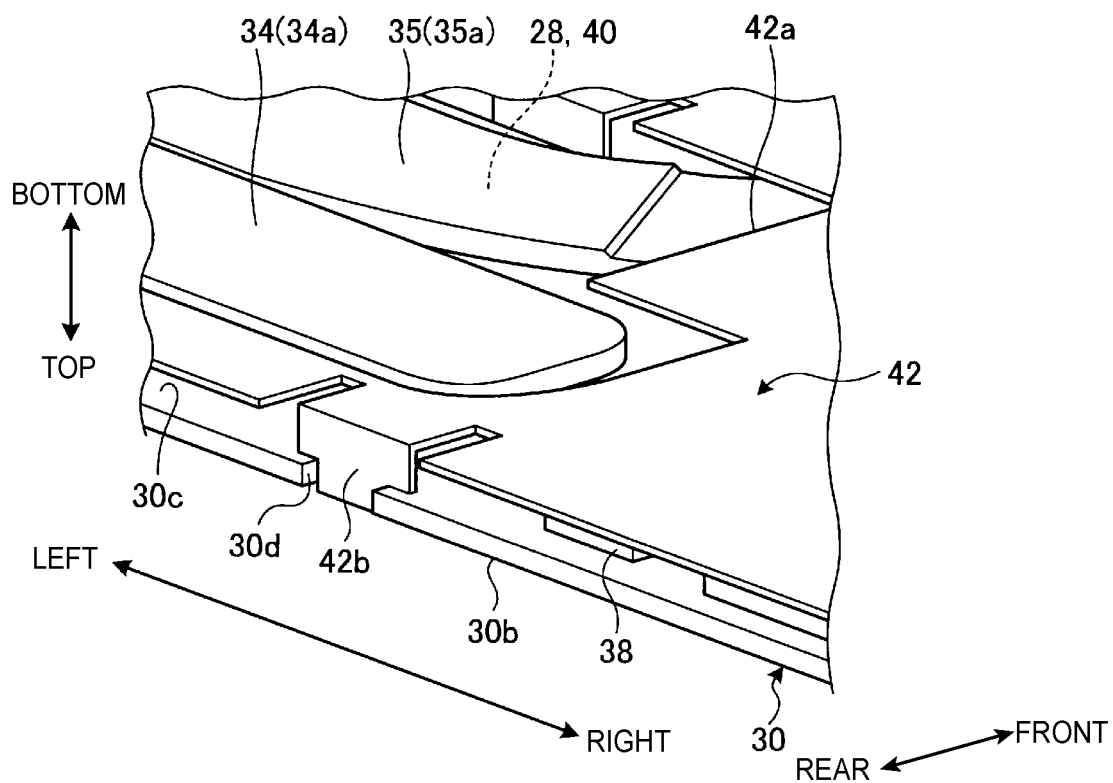
FIG. 6B is a perspective view illustrating of a state where the heat absorbing member is attached to the substrate.

FIG. 6A is an exploded perspective view illustrating one example of a structure of attaching the heat absorbing member 42 to the substrate 30. FIG. 6B is a perspective view illustrating one example of a state where the heat absorbing member 42 is attached to the substrate 30.

As illustrated in FIG. 6A and FIG. 6B, the heat absorbing member 42 has a plurality of hooks 42b which project upward in a sheet thickness direction. Each hook 42b is an elastic piece which is formed into an almost U-shape in section by cutting and raising an end face of the heat absorbing member 42. Some of the respective hooks 42b are provided on a rear end face of the heat absorbing member 42 and other hooks 42b are provided on a front edge end face of the clearance hole 42a. The respective hooks 42b are inserted into concave parts 30d formed in a front end face and a rear end face of the substrate 30 from the lower face 30c side and claws 42c which are formed on leading ends of the hooks 42b are locked to the rear face (the upper face 30b) of the substrate 30. Thereby, the heat absorbing member 42 is engaged with and supported by the substrate 30 by using the respective hooks 42b. Alternatively, the hooks 42b may be brought into engagement with the end face of the substrate 30 directly without forming the concave parts 30d in the substrate 30. The heat absorbing, member 42 may be partially screwed to the substrate 30 and may be attached to the substrate 30 only by screwing by omitting the hooks 42b, not attached to the substrate 30 only with the hooks 42b.

The heat absorbing member 42 is engaged with and supported by the substrate 30 by at least partially using the hooks 42b in this way. Thereby, it is not necessary to provide a screwing stud and so forth for attaching the heat absorbing member 42 to the substrate 30 unlike the prior art or it is possible to reduce the installation number of the studs and so forth. Consequently, since a wiring region around the CPU 28 is not largely reduced on the substrate 30, wiring efficiency of the substrate 30 is improved and miniaturization of the substrate 30 becomes possible.

As illustrated in FIG. 4 and FIG. 5, the keyboard device 12 is disposed in a state of being exposed to the upper face of the main body chassis 14 via the opening 26. The keyboard device 12 may have a structure other than that in the present embodiment that the keyboard device 12 is attached into the opening 26 in the upper-face cover 22 which serves as a frame from below and may have, for example, a frame-integrated structure that the keyboard device 12 is installed in a concave part formed in the upper-face cover 22 in place of the opening 26. The keyboard device 12 is an assembly component that a keytop 44, a guide mechanism 45, a membrane sheet 46 and a base plate 47 are disposed, for example, from the top in order. The keytop 44 is a component which works as an operation unit on which a user performs a pressing operation. The guide mechanism 45 is a pantograph mechanism which guides the keytop 44 to be movable upward/downward on the upper face side of the base plate 47. One set of the keytop 44 and the guide mechanism 45 configures one key (a key switch) 48 and a plurality of the keys 48 is disposed on the upper face bide of the base plate 47 in a predetermined arrangement. The keyboard device 12 may be a membrane-type one and so forth having no guide mechanism 45. The membrane sheet 46 is a switch sheet which transmits a signal according to the kind of each key by closing a contact by being pressed by a not illustrated rubber dome and so forth when the keytop 44 is pressed down. The base plate 47 is a member which forms the bottom face of the keyboard device 12 and is a thin plate-shaped member which is made of stainless steel and so forth.

As illustrated in FIG. 1 and FIG. 4, in a keyboard device of a general key arrangement, function keys and so forth are allocated to rearmost-row keys 48a which belong to a group of keys 48 which are arranged side by side in the left-right direction on the rearmost end side of the keyboard device 12 in the respective keys 48. On the other hand, keys such as alphabet keys, symbols keys, space keys, control keys and so forth are allocated to keys 48b which belong to groups of the keys 48 other than the rearmost-row keys 48a. Therefore, the opportunity that the rearmost-row keys 48a are operated is low in comparison with the opportunity of the other keys 48b and also quality requirement for a punching touch and an operational feeling of the rearmost-row keys 48a is low. Accordingly, in the present embodiment, a structure that a vertical motion stroke of the rearmost-row keys 48a is smaller than the vertical motion stroke of other keys 48b is adopted in the keyboard device 12 (see FIG. 4).

In the configuration example illustrated in FIG. 4, a thickness measured from the top face of the keytop 44 to the lower face of the base plate 47 at a position where the rearmost-row keys 48a are disposed is set to, for example, 2.25 mm. On the other hand, a thickness measured from the top face of the keytop 44 to the lower face of the base plate 47 at a position where the keys 48b are disposed is set to, for example, 4.5 mm. Therefore, in the keyboard device 12, a height of a space S2 between the base plate 47 and the lower-face cover 24 at a position located under the rearmost-row keys 48a is larger than a height of a space S1 between the heat diffusion component 37 and the lower-face cover 24 at a position located under the respective keys 48b other than the rearmost-row keys 48a. That is, the space S2 is increased in height dimension in comparison with the space S1. Parts of the heat transport components 34 and 35 and a part of the heat absorbing member 42 are disposed in this height-increased space S2 (see FIG. 4).

Figure 7:
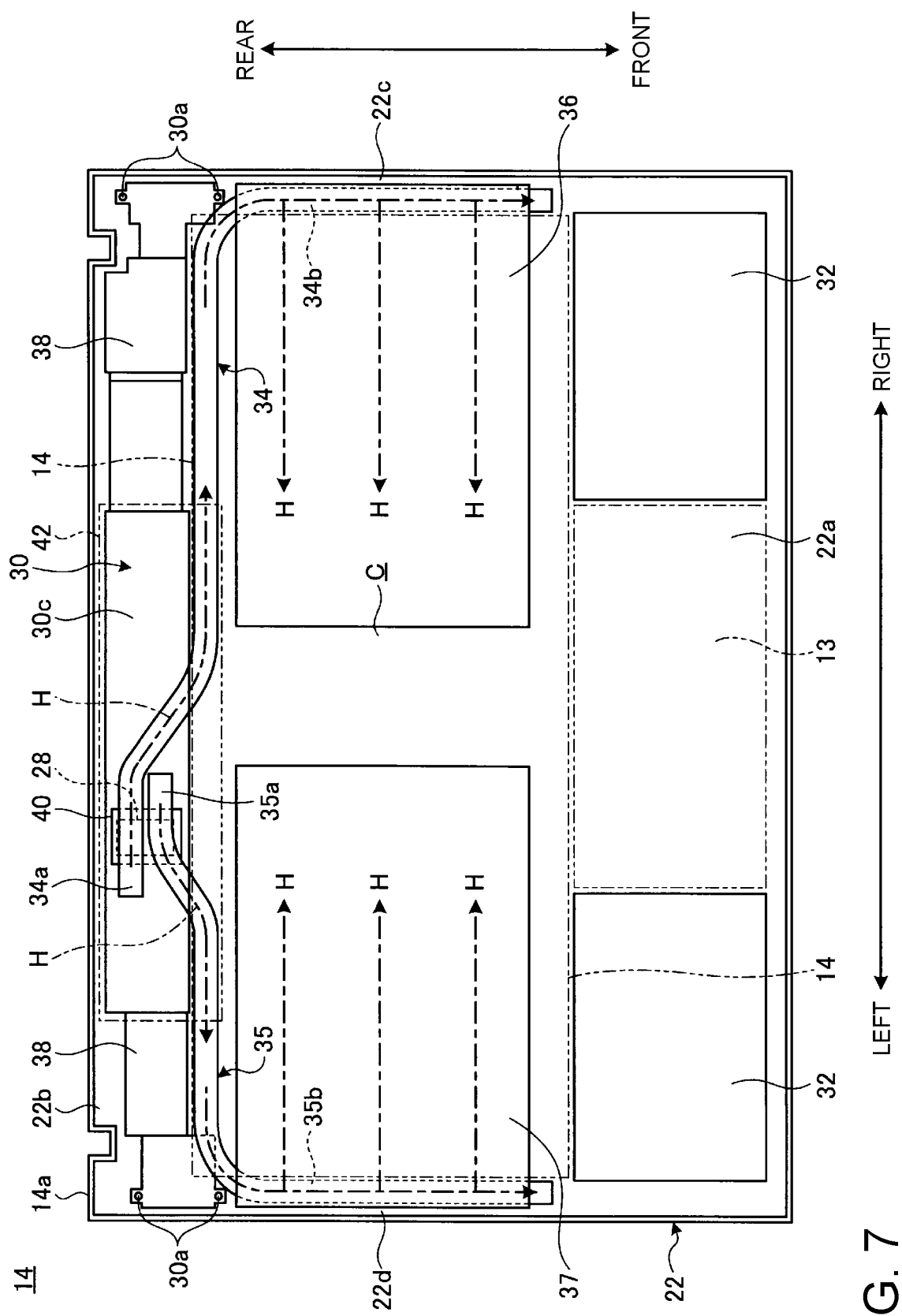
FIG. 7 is a diagram illustrating a flow of heat in the main body chassis illustrated in FIG. 3.

Then, a heat radiating operation in the main body chassis 14 of the electronic apparatus 10 so configured will be described. FIG. 7 is an explanatory diagram schematically illustrating one example of a flow of heat H in the main body chassis 14 in FIG. 3.

As indicated by a one-point-chain lined arrow in FIG. 7, the heat H generated from the CPU 28 is absorbed at the one ends 34a and 35a of the heat transport components 34 and 35 via the heat receiving plate 40 and is efficiently transported to the other ends 34b and 35b. Then, the heat is transferred from the other ends 34b and 35b to the respective heat diffusion components 36 and 37 and is efficiently diffused and stored in the heat diffusion components 36 and 37 and then is radiated. In addition, part of the heat generated from the CPU 28 and the electronic components 38 is diffused and radiated also by the heat absorbing member 42.

As described above, the electronic apparatus 10 according to the present so embodiment includes the main body chassis 14 equipped with the keyboard device 12 and the CPU 28 is disposed on the rear end side beyond the keyboard device 12 in the main body chassis 14?

Accordingly, in the electronic apparatus 10 according to the present embodiment, the CPU 28 is disposed at a position which deviates toward the rear side of the keyboard device 12 for which a space which is comparatively large in the top-bottom direction is necessary in the main body chassis 14 and where it is possible to secure the space which is comparatively large in the top-bottom direction. That is, in the electronic apparatus 10 according to the present embodiment, the CPU 28 for which a space which is made large to some extent in the top-bottom direction is necessary in the main body chassis 14 is not built up under the keyboard device 12. Therefore, in the electronic apparatus 10 according to the present embodiment, it is possible to promote thinning of the main body chassis 14 equipped with the CPU 28 (see FIG. 4).

In addition, in the electronic apparatus 10 according to the present embodiment, in the substrate 30, the section on which at least the CPU 28 and the electronic components 38 other than the CPU 28 are mounted is disposed at the position where the keyboard device 12 and the section are not mutually superposed. Accordingly, in the electronic apparatus 10 according to the present embodiment, the keyboard device 12 and the section of the substrate 30 on which the CPU 28 and the electronic components 38 are mounted are not mutually superposed. Accordingly, in the electronic apparatus 10 according to the present embodiment, more thinning of the main body chassis 14 is possible.

In addition, in the electronic apparatus 10 according to the present embodiment, the CPU 28 which is disposed on the rear end side beyond the keyboard device 12, the heat diffusion components 36 and 37 which are disposed under the keyboard device 12 in the mutually superposed state and the heat transport components 34 and 35 which connect between the CPU 28 and the heat diffusion components 36 and 37 are disposed in the main body chassis 14.

Accordingly, in the electronic apparatus 10 according to the present embodiment, the heat H generated from the CPU 28 is transported to the heat diffusion component 36 and 37 via the heat transport components 34 and 35 and is diffused, stored and radiated in the heat diffusion components 36 and 37. Accordingly, it is possible to efficiently absorb the heat generated from the CPU 28 and so forth and the time taken until the CPU 28 is thermally saturated is elongated, in particular, even in a state where a processing burden on the CPU 28 is increased. Therefore, it is possible to suppress a reduction in processing speed of the CPU 28. Moreover, in the electronic apparatus 10 according to the present embodiment, the CPU 28 for which the space which is made large to some extent in the top-bottom direction is necessary in the main body chassis 14 and parts including the one ends 34a and 35a of the heat transport components 34 and 35 which are connected to the CPU 28 are not built up under the keyboard device 12. On the other hand, the heat diffusion components 36 and 37 which are made thin with ease but for which a large closed space volume is necessary are disposed in the space S1 located under the keyboard device 12 under which a space which is low in height but is large is secured because the CPU 28 and so forth are not disposed. Therefore, in the electronic apparatus 10 according to the present embodiment, it is possible to obtain the highly efficient heat diffusion performance while promoting thinning of the main body chassis 14 equipped with the CPU 28 and a component for cooling the CPU 28.

In the electronic apparatus 10 according to the present embodiment, the CPU 28 is disposed in the main body chassis 14 in a state of being mounted on the substrate 30 and the substrate 30 is disposed at the position located under the rear cover part 22b of the upper-face cover 22 in the mutually superposed state. It is possible to prevent thinning of the main body chassis 14 from being hindered by disposing the substrate 30 and the CPU 28 under the rear cover part 22b under which, it is comparatively easy to secure the top-bottom direction space unlike the position located under the keyboard device 12. In addition, since the substrate 30 on which the CPU 28 which is the heating element and the electronic components 38 which are other heating elements are mounted is disposed under the rear cover part 22b on the rear side of the keyboard device 12, it is possible to avoid inconvenience that a hand of a user is heated with the heat generated from the CPU 28 and the electronic components 38.

In the electronic apparatus 10 according to the present embodiment, the heat transport components 34 and 35 are made to pass through a position located under the rearmost-row keys 48a in the mutually superposed state. As described above, it is easy to make the vertical motion stroke of the rearmost-row keys 48a small in comparison with the other keys 48b such as the alphabet keys and so forth. Thus, it is possible to secure the space S2 which is more increased in thickness than the space S1 located under the other keys 48b under the rearmost-row keys 48a. Thereby, it becomes possible to ensure the highly efficient heat transport performance while suppressing an increase in sheet thickness of the main body chassis 14 by disposing the heat transport components 34 and 35 which are comparatively large in thickness in the space S2.

In the electronic apparatus 10 according to the present embodiment, the heat transport components 34 and 35 are made to pass through the position which deviates toward the side part of the keyboard device 12 and which is located under the side cover parts 22c and 22d in the mutually superposed state. Thereby, it becomes possible to surely connect the heat transport components 34 and 35 which are comparatively large in thickness to the heat diffusion components 36 and 37 which are disposed under the keyboard device 12 while suppressing mutual superposition of the heat transport components 34 and 35 and the keyboard device 12.

Incidentally, it goes without saying that the present invention is not limited to the above-described embodiment and can be freely altered and modified within the range not deviating from the gist of the present invention.

For example, the keyboard device 12 may be configured by an on-screen. keyboard (a software keyboard) which is displayed on a touch-type liquid crystal display. In addition, in the keyboard device 12, some keys 48, for example, only the rearmost-row keys 48a which are low in use frequency may be configured by the on-screen keyboard which is displayed on the touch-type liquid crystal display. In this case, the keytop 44 and the guide mechanism 45 used for the rearmost-row keys 48a become unnecessary and therefore it becomes possible to more increase the space S2 in FIG. 4.

Although in the above description, the clamshell-type electronic apparatus 10 that the display chassis 18 is coupled to the main body chassis 14 to be rotationally movable is exemplified. However, the electronic apparatus 10 may have a configuration and so forth that the display chassis 18 which is configured by, for example, a tablet-type PC and so forth is made detachable relative to the main body chassis 14, In other words, in a case where the keyboard device 12 is configured by such the on-screen keyboard as described above, in the electronic apparatus 10 according to the present embodiment, the display chassis 18 may be omitted and the electronic apparatus 10 may be configured by, for example, the tablet-type PC and so forth that a display which also serves as the on-screen keyboard is disposed on the upper face of the main body chassis 14. Also, in this case, the CPU 28 may be disposed at the position which deviates from the display which serves as the keyboard device 12.

As has been described, the present invention provides an improved electronic apparatus with a processor being disposed within a main body chassis.

While the invention has been particularly shown and described with reference to a preferred embodiment, it will be understood by those skilled in the art that various changes in form and detail may be made therein without departing from the spirit and scope of the invention.

What is claimed is:

1. An electronic apparatus comprising:
    a main body chassis equipped with an upper-face cover having at least a rear cover part located on a rear end side, and a front cover part located on a front end side;
    a keyboard device disposed between said rear cover part located on said rear end side and front cover part located on said front end side;
    a central processing unit (CPU) disposed on said rear end side beyond said keyboard device;
    a first heat diffusion component and a second heat diffusion component disposed at a position located under said keyboard device in a mutually superposed state, wherein said first and second heat diffusion components are separate from said keyboard device;
    a first heat transport component connected between said CPU and said first heat diffusion component to provide heat transfer; and
    a second heat transport component connected between said CPU and said second heat diffusion component to provide heat transfer.

2. An electronic apparatus comprising:
    a main body chassis equipped with a keyboard device, wherein said main body chassis includes an upper-face cover with an upper face, wherein said upper-face cover has at least a rear cover part located on a rear end side beyond a position where said keyboard device is disposed, and a front cover part located on a front end side ahead of the position where said keyboard device is disposed, wherein said upper-face cover includes side cover parts on said left and right sides of a position where said keyboard device is disposed;

a central processing unit (CPU) disposed on said rear end side beyond said keyboard device;

a heat diffusion component disposed at a position located under said keyboard device in a mutually superposed state; and a heat transport component connected between said CPU and said heat diffusion component to provide heat transfer, wherein said heat transport component includes two heat pipes, wherein one of said heat pipes is made to pass through a position located under said side cover part on said left side of said keyboard device in said mutually superposed state, and another one of said heat pipes is made to pass through a position located under said side cover part on said right side of said keyboard device in said mutually superposed state.

3. The electronic apparatus of claim 2, wherein said CPU is disposed in said main body chassis in a state of being mounted on a substrate and said substrate is disposed at a position located under said rear cover part in said mutually superposed state.

4. The electronic apparatus of claim 2, wherein said heat transport component is made to pass through a position located under rearmost-row keys that are arrayed side by side in a left-right direction on said rearmost end side in a plurality of keys on said keyboard device in said mutually superposed state.

5. The electronic apparatus of claim 2, wherein said heat transport component is made to pass through a position that deviates towards a side part of said keyboard device and is located under said side cover part in said mutually superposed state.

6. The electronic apparatus of claim 2, wherein said heat diffusion component is provided as one pair of left and right heat diffusion components, said one heat pipe is connected to one heat diffusion component and said another one heat pipe is connected to said other heat diffusion component.

7. The electronic apparatus of claim 2, wherein a gap in which wiring is to be laid is provided between said pair of said heat diffusion components.

8. The electronic apparatus of claim 2, wherein a battery device is disposed at a position located under said front cover part in said mutually superposed state; and said wiring includes a power source line that is connected between said battery device and said substrate.

9. An electronic apparatus comprising:

a main body chassis equipped with a keyboard device, wherein said main body chassis includes an upper-face cover with an upper face, wherein said upper-face cover has at least a rear cover part located on said rear end side beyond a position where said keyboard device is disposed, and a front cover part located on said front end side ahead of the position where said keyboard device is disposed;

a central processing unit (CPU) disposed on said rear end side beyond said keyboard device, wherein said CPU is mounted on a substrate disposed under said rear cover part;

a heat diffusion component disposed at a position located under said keyboard device in a mutually superposed state;

a first heat transport component connected between said CPU and said heat diffusion component to provide heat transfer;

a second heat transport component connected between said CPU and said second heat diffusion component to provide heat transfer; and a heat absorbing member covers said CPU and at least parts of said substrate and said heat transport component.

10. The electronic apparatus of claim 9, wherein said heat absorbing member has a hook that projects in a sheet thickness direction of said heat absorbing member and is engaged with and supported by said substrate using said hook.

\* \* \* \* \*